(12) United States Patent
Osako et al.

(10) Patent No.: US 9,530,309 B2
(45) Date of Patent: Dec. 27, 2016

(54) OBJECT DETECTION SYSTEM

(75) Inventors: Kazunori Osako, Shiga-ken (JP);
Keisaku Kikuchi, Shiga-ken (JP); Toru Murata, Shiga-ken (JP)

(73) Assignee: OMRON CORPORATION, Kyoto (JP)

( * ) Notice: Subject to any disclaimer, the term of this patent is extended or adjusted under 35 U.S.C. 154(b) by 557 days.

(21) Appl. No.: 13/985,694

(22) PCT Filed: Oct. 26, 2011

(86) PCT No.: PCT/JP2011/074648
§ 371 (c)(1),
(2), (4) Date: Oct. 15, 2013

(87) PCT Pub. No.: WO2012/111196
PCT Pub. Date: Aug. 23, 2012

(65) Prior Publication Data
US 2014/0028436 A1    Jan. 30, 2014

(30) Foreign Application Priority Data

Feb. 16, 2011 (JP) ................................. 2011-031244

(51) Int. Cl.
*G05B 19/18* (2006.01)
*G06M 7/00* (2006.01)
(Continued)

(52) U.S. Cl.
CPC .................. *G08C 19/00* (2013.01); *G01V 8/20* (2013.01); *H03K 17/943* (2013.01); *H03K 2217/94114* (2013.01)

(58) Field of Classification Search
CPC ..................................................... G08C 19/00
(Continued)

(56) References Cited

U.S. PATENT DOCUMENTS 6,411,856 B1 * 6/2002 Takeuchi ........... G05B 19/0421
700/2
7,103,422 B2  9/2006 Takeuchi et al.
(Continued)

FOREIGN PATENT DOCUMENTS

EP    0930712    3/1998
EP    2199833    6/2010
(Continued)

OTHER PUBLICATIONS

European Search Report in EP Application No. 11858650.2, dated Jun. 10, 2014.
(Continued)

*Primary Examiner* — Jennifer Mehmood
*Assistant Examiner* — John Mortell
(74) *Attorney, Agent, or Firm* — Greenblum & Bernstein, P.L.C.

(57) ABSTRACT

In a projector or an optical receiver, a master device produces pieces of definition information that determines timings of detection processes in the device including its own device and transmits the pieces of definition information to the slave device. The master device simultaneously transmits commands to require operations of internal timers to be synchronized with each other to the other slave devices in response to elapse of a time corresponding to a period in which a circulating period of the detection processes of the sensors proceeds by a predetermined cycle. Each of the slave devices corrects the timer in response to the command, and determines a timing at which a detection process should be performed with reference to a time point for correction on the basis of the definition information matched with its own device to execute the detection process.

8 Claims, 8 Drawing Sheets

(51) Int. Cl.
    *G08C 19/00* (2006.01)
    *G01V 8/20* (2006.01)
    *H03K 17/94* (2006.01)
(58) Field of Classification Search
    USPC .......................................................... 340/3.2
    See application file for complete search history.

(56) References Cited

U.S. PATENT DOCUMENTS

| | | |
|---|---|---|
| 2004/0210322 A1 | 10/2004 | Takeuchi et al. |
| 2006/0071154 A1* | 4/2006 | Osako ..................... G01V 8/20 250/221 |
| 2007/0104486 A1 | 5/2007 | Hiraka |
| 2008/0179505 A1 | 7/2008 | Inoue et al. |

FOREIGN PATENT DOCUMENTS

| | | |
|---|---|---|
| JP | 98/10516 | 3/1998 |
| JP | 2002-305433 A | 10/2002 |
| JP | 2003-16891 | 1/2003 |
| JP | 2003-158448 | 5/2003 |
| JP | 2006-317238 | 11/2006 |
| JP | 4576065 B2 | 8/2010 |
| WO | 02/101475 | 12/2002 |

OTHER PUBLICATIONS

International Search Report in PCT/JP2011/074648, along with English language translation, mailing date Jan. 31, 2012.
International Preliminary Examination Report and Written Opinion of the International Searching Authority in PCT/JP2011/074648, along with English language translation, mailing date Jan. 31, 2012.

* cited by examiner

OBJECT DETECTION SYSTEM

TECHNICAL FIELD

The present invention relates to an object detection system configured such that projectors and optical receivers of a plurality of multiple-optical-axis photoelectric sensors are connected to each other through a communication line to cause detection processes of the sensors to sequentially proceed.

Note that the multiple-optical-axis photoelectric sensor may also be simply called a "sensor" hereinafter. The projector and the optical receiver may be collectively called "devices".

BACKGROUND ART

A multiple-optical-axis photoelectric sensor is a sensor in which a projector and an optical receiver having a plurality of optical elements are arranged to face each other to set a detection area configured by a plurality of optical axes. This sensor executes a detection process by a method that sequentially enables the optical axes to check the light incidence state of each of the optical axes. In a multiple-optical-axis photoelectric sensor used for safety, an output is set in an on state (high level) while the detection process determines that the detection area is not light-shielded, and the output is turned off when the detection area is light-shielded.

The projector and the optical receiver of the multiple-optical-axis photoelectric sensor, in the above detection process, communicate with each other to synchronize light projection/reception, and can also communicate with a projector and an optical receiver of another sensor. There is some system that is configured such that, by using the communication function, projectors and optical receivers of a plurality of sensors are connected to each other through a communication line to cause detection processes in the respective sensors to sequentially proceed on the basis of communication between the sensors.

As a concrete conventional technique, Patent Document 1 describes that a sensor at one terminal of a plurality of connected sensors is used as a master sensor, after the master sensor executes the first detection process, an instruction to start detect is transmitted to a sensor having an order lower than that of the master sensor by one, and the sensors sequentially perform the same operations to cause the detection processes to sequentially proceed from an upper order to a lower order.

Patent Document 1 also describes that the projectors and the optical receivers of the sensors exchange signals between upper-order and lower-order devices on activation and determine whether their own devices are master devices or slave devices on the basis of the presence/absence of inputs of the signals.

FIG. 8 shows a sequence of a conventional detection process similar to the method described in Patent Document 1. In this example, in a system including a sensor Sa including a projector 1a and an optical receiver 2a, a sensor Sb including a projector 1b and an optical receiver 2b, and a sensor Sc including a projector 1c and an optical receiver 2c that are connected to each other in a state in which the projectors and the optical receivers can communicate with each other, communication to transfer detection processes are performed between the optical receivers 2a, 2b, and 2c of the sensors Sa, Sb, and Sc (this communication will be called "inter-sensor communication" hereinafter). Also between the optical receivers and the projectors configuring each of the sensors Sa, Sb, and Sc, communication to synchronize operation timings of detection processes is performed (this communication will be called "in-sensor communication" hereinafter).

More specifically, a detection process is executed after the sensor Sa executes the in-sensor communication and instructs the second sensor Sb to start a detection process. After the sensor Sb that receives the instruction returns a response signal to the sensor Sa, the sensor Sb executes in-sensor communication and a detection process to instruct the third sensor Sc to start a detection process. After the sensor Sc that receives the instruction returns a response signal to the sensor Sb, the sensor Sc executes in-sensor communication and a detection process to instruct the third sensor Sa to start a detection process. The processes executed up to now are set as one cycle, and the same sequence is repeated to circulate the detection processes by the sensors Sa, Sb, and Sc.

PRIOR ART DOCUMENT

Patent Document

Patent Document 1: Domestic Re-publication of PCT International Publication for Patent Applications WO/10516

SUMMARY OF THE INVENTION

Problems to be Solved by the Invention

In the sequence shown in FIG. 8, since inter-sensor communication or in-sensor communication need to be performed in every detection process, a cycle of detection processes of the sensors cannot be easily shortened.

The present invention has been made in consideration of the above problems and, has as its object to eliminate necessity of perform inter-sensor communication and in-sensor communication in every detection process to shorten a circulating cycle of detection processes of the sensors so as to increase the processing speed in an entire system.

Means for Solving the Problem

The present invention is applied to an object detection system configured such that projectors and optical receivers of a plurality of multiple-optical-axis photoelectric sensors are connected to each other through communication lines to cause detection processes of the respective sensors to sequentially proceed on the basis of communication between the sensors. In the system, a projector and an optical receiver of each of the multiple-optical-axis photoelectric sensors include timers to determine operation timings in their own devices, and one of the devices functions as a master device.

A master device includes a definition information producing unit configured to produce pieces of definition information that determine timings of detection processes in the respective devices including its own device on the basis of relationships (the number of sensors, a connection order of the devices, correspondences between the projectors and optical receivers, and the like) between the sensors in the system and the number of optical axes of the sensors, a definition information transmitting unit configured to transmit the pieces of definition information to the other devices in the system respectively, a timer control unit configured, while recognizing a circulating period of the detection processes in the respective sensors on the basis of a measured time obtained by the timer of its own device and the definition information, to simultaneously transmit commands to require the operations of the timers to be synchronized with each other to the other devices in response to elapse of a time corresponding to a period in which the circulating period proceeds by a predetermined cycle, and a detection control unit configured to determine timings at which the detection process should be executed on the basis of definition information matched with its own device to execute the detection process.

Each of the devices except for the master device includes a storage unit configured to store the definition information transmitted from the master device, a timer correction unit configured to correct the timer of its own device depending on a command from the master device, and a detection control unit configured to determine a timing at which a detection process should be executed with reference to a time point at which the timer is corrected on the basis of determination information matched with its own device to execute the detection process.

According to the system, a projector or an optical receiver in any one sensor of the plurality of sensors serves as a master device, timings of detection processes in the respective devices including its own device in the system are determined, and pieces of definition information representing the timings are transmitted to the devices, respectively. Each of the devices, on the basis of the definition information matched with its own device, uniquely determines a timing of a detection process depending on a measured time of the timer to execute the detection process. However, since an operation of the timer of each of the devices is corrected depending on a command from the master device to synchronize the timings of time measurements, selections of the optical axes of the projector and the optical receiver can be avoided from being different from each other, the detection processes in the sensors can be avoided from overlapping, and an order of detection processes is avoided from changing.

In a first embodiment of the system, the definition information producing unit of the master device produces, for the respective devices including its own device, definition information representing a waiting time from a reference time point until the detection process is started. The timer control unit executes simultaneous transmission of commands to require the operations of the timers to be synchronized each time a time corresponding to a period in which a circuit of the detection processes of the sensors is made has elapsed. The detection control unit of each of the devices except for the master device sets a time point at which the timer is corrected as a reference time point, and the master device sets a time point at which a time from transmission of a command until the timers of the other devices are corrected has elapsed as a reference time point. In response to elapse of a waiting time represented by the definition information matched with its own device from each of the reference time points respectively, the detection process is executed.

In a second embodiment of the system, the definition information producing unit of the master device produces, for the respective devices including its own device, definition information including information representing a waiting time from a reference time point until a detection process is executed and information representing a circulating period of the detection processes. The timer control unit of the master device executes simultaneous transmission of commands to require time synchronization of the timers in response to elapse of a time corresponding to a period in which the detection processes of the respective sensors are circulated by two or more predetermined cycles. The detection control unit of each of the devices except for the master device sets a time point at which the timer is corrected as a reference time point respectively, and the master device sets a time point at which a time from transmission of a command until the timers of the other devices are corrected has elapsed as a reference time point. In response to elapse of a waiting time represented by the definition information matched with its own device from each of the reference time points, the detection processes are respectively executed and then, the detection processes are repeatedly executed according to a circulating period represented by the definition information.

According to the first and second embodiments, on the initiative of the master device, after operations of the timers of all the devices are synchronized with each other, the devices can independently start detection processes at correct timings, respectively.

In a third embodiment of the system, the master device further includes a timing change unit configured to change definition information matched with its own device such that a start timing of a detection process in its own device is changed. The timer control unit of the master device, before a detection process based on the definition information changed by the timing change unit is started, simultaneously transmits information representing a timing difference between a start timing of a detection process before the change of the definition information and a start timing of a detection process after the change of the definition information to the other devices together with commands to require the operations of the timers to be synchronized. In each of the devices that receives the transmission, the timer of its own device is corrected according to the command, and definition information in the storage unit of its own device is updated by using the information transmitted together with the command before the detection process in its own device is started.

According to the third embodiment, in the master device, when the start timing of the detection process must be changed due to some condition, the master device simultaneously transmits information of a timing difference between a start timing of a present detection process and a start timing after the change to the other devices together with a command to require the operations of the timing to be synchronized with each other. In each of the devices, since the definition information is changed by using the information before the detection process in its own device is started, immediately after the timer is corrected, the detection process can be started on the basis of the changed definition information. In this manner, in response to a change of the start timing of the detection process by the master device, the other devices can also change start timings of the detection processes.

In a fourth embodiment, the timer control unit of the master device simultaneously transmits information that should be shared by the devices including its own device to the other devices together with a command to require the operations of the timers to be synchronized with each other. For example, in order to perform a muting process, when a detection signal from an external muting sensor is recognized by the master device, information representing the recognition result can be transmitted to the other respective devices.

In a fifth embodiment, the definition information producing unit of the master device is activated and then communicates with the other devices to recognize a relationship between the sensors in the system and the number of axes of each of the sensors, and produces definition information on the basis of the recognition result, and the definition information transmitting unit transmits the definition information to the other devices in response to completion of production of the definition information.

According to the embodiment, since each time the system is activated, definition information is produced on the basis of a relationship between sensors in the system and the number of optical axes and transmitted to the devices, even though the configuration of the system is changed, each of the devices is restarted to make it possible to operate each of the devices by a definition set depending on the changed configuration.

Effect of the Invention

According to the present invention, definition information for determining a timing of a detection process is registered in each of the devices, while operations of the timers of the devices are arbitrarily synchronized with each other by a command from the master device, each of the devices spontaneously executes the detection process on the basis of a measured time of the timer and the definition information. For this reason, the devices need not communicate with each other each time a detection process is performed, and a circulation cycle of the detection processes can be considerably shortened. Thus, a system that can achieve a high-speed detection process can be provided.

MODE FOR CARRYING OUT THE INVENTION

Figure 1:
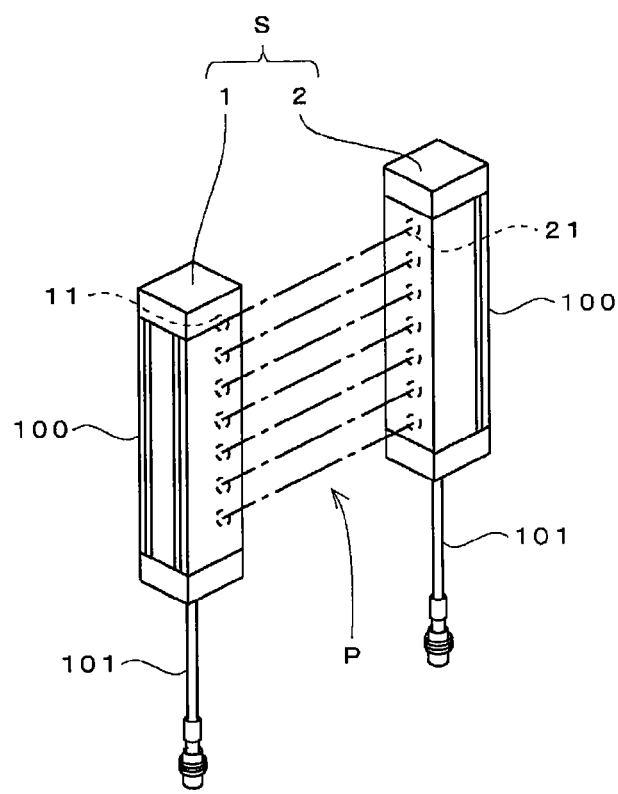
FIG. 1 is a perspective view showing an appearance of a multiple-optical-axis photoelectric sensor.

FIG. 1 shows an appearance of a multiple-optical-axis photoelectric sensor to which the present invention is applied.

A multiple-optical-axis photoelectric sensor S according to the embodiment is obtained by pairing a projector 1 and an optical receiver 2. The projector 1 and the optical receiver 2 include rectangular parallelepiped casings 100 as main bodies, respectively. In each of the casings 100, a plurality of optical elements (light emitting element 11 in the projector 1, and a light receiving element 21 in the optical receiver 2) and a control circuit board (not shown) are housed.

In a front surface of each of the casings 100, a window portion to transmit light is formed. The light emitting elements 11 and the light receiving elements 21 are arranged to be aligned along the longitudinal direction of the casings 100 in a state in which a projection surface or a light receiving surface faces the window portion. The projector 1 and the optical receiver 2 are arranged to face each other with a predetermined interval such that the light emitting element 11 and the light receiving element 21 face each other in a one-to-one relationship, so that a detection area P configured by a plurality of optical axes is formed between the projector 1 and the optical receiver 2.

Figure 2:
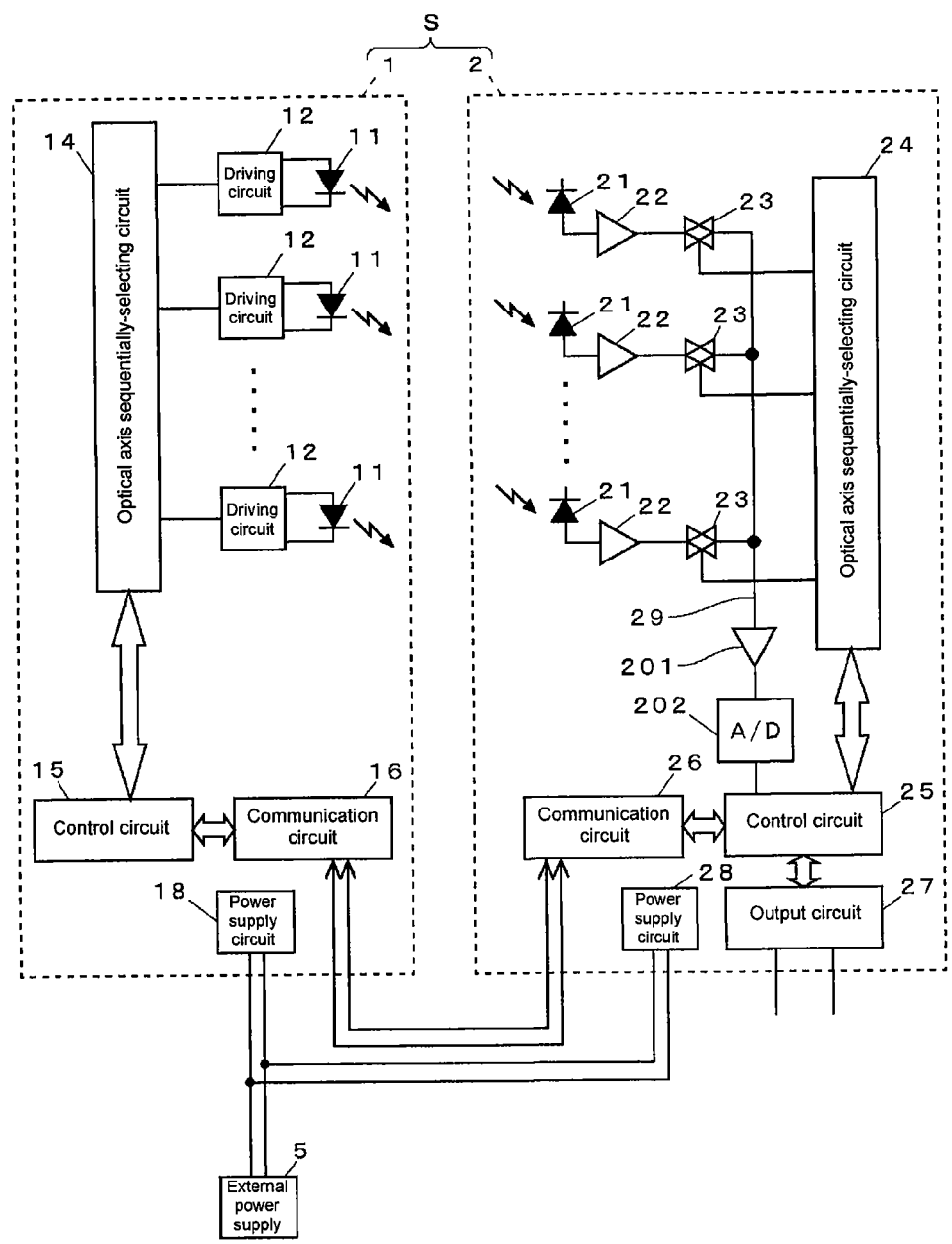
FIG. 2 is a block diagram showing a main circuit diagram of the multiple-optical-axis photoelectric sensor.

FIG. 2 shows a configuration of a main circuit included in the multiple-optical-axis photoelectric sensor S.

In the projector 1, in addition to the light emitting elements 11, a driving circuit 12 for each of the light emitting elements 11, an optical axis sequentially-selecting circuit 14, a control circuit 15, a communication circuit 16, a power supply circuit 18, and the like are arranged. Each of the light emitting elements 11 is connected to the control circuit 15 through the driving circuit 12 and the optical axis sequentially-selecting circuit 14.

In the optical receiver 2, in addition to the light receiving elements 21, an amplification circuit 22 and an analog switch 23 that are arranged for each of the light receiving elements 21, an optical axis sequentially-selecting circuit 24, a control circuit 25, a communication circuit 26, an output circuit 27, and a power supply circuit 28 are arranged. On a transmission line 29 extending from each of the analog switches 23 to the control circuit 25, an amplification circuit 201 and an A/D conversion circuit 202 are arranged.

In the projector 1 and the optical receiver 2 in the above configuration, the power supply circuits 18 and 28 receive a power from a common external power supply 5 to supply a power to the circuits in its own device. The control circuits 15 and 25 include memories and timers (will be described later) and can communicate with each other through the communication circuits 16 and 26. The output circuit 27 includes two output terminals, and signal lines connected to the terminals, respectively, are connected to a power supply circuit (not shown) of a machine in a dangerous area.

Each of the control circuits 15 and 25 sequentially switches selections of optical axes by the optical axis sequentially-selecting circuits 14 and 24 in a top-to-bottom direction one by one. The control circuit 15 of the projector 1 outputs a lighting control signal at a timing at which the selections of the optical axes are switched, the control circuit 25 of the optical receiver 2 turns on the analog switch 23 corresponding to the selected optical axis at a timing at which the selections of the optical axes are switched. An amount-of-received-light signal, of an optical axis selected as described above, obtained by the light receiving element 21 is guided to the transmission line 29, and amount-of-received-light data produced through amplification by the amplification circuit 201 and digital conversion by the A/D conversion circuit 202 is input to the control circuit 25. Since a selection of an optical axis on the projector 1 side and a selection of an optical axis on the optical receiver 2 side are executed at a synchronized timing, an amount of received light in the light receiving element 21 corresponding to the lighted light emitting element 11 is input to the control circuit 25 of the optical receiver 2 every time.

The control circuit 25 compares the input amount-of-received-light data with a predetermined light incidence threshold value to determine whether a selected optical axis is light-shielded. Each time the circuit of selections of optical axes is made, determination results of the optical axes are integrated, and it is determined whether the detection area P is light-shielded.

A process of making the circuit of projecting processes and light receiving processes of each optical axis to determine whether the detection area P is light-shielded is called a "detection process". As described above, the detection process is realized by cooperation control of the control circuits 15 and 25 of the projector 1 and the optical receiver 2 and repeated with a predetermined circulating period. While it is determined that the detection area P is not light-shielded, a high-level detection signal is output from an output circuit of the optical receiver 2. However, when it is determined that the detection area P is light-shielded, the detection signal is switched to a low level.

Figure 3:
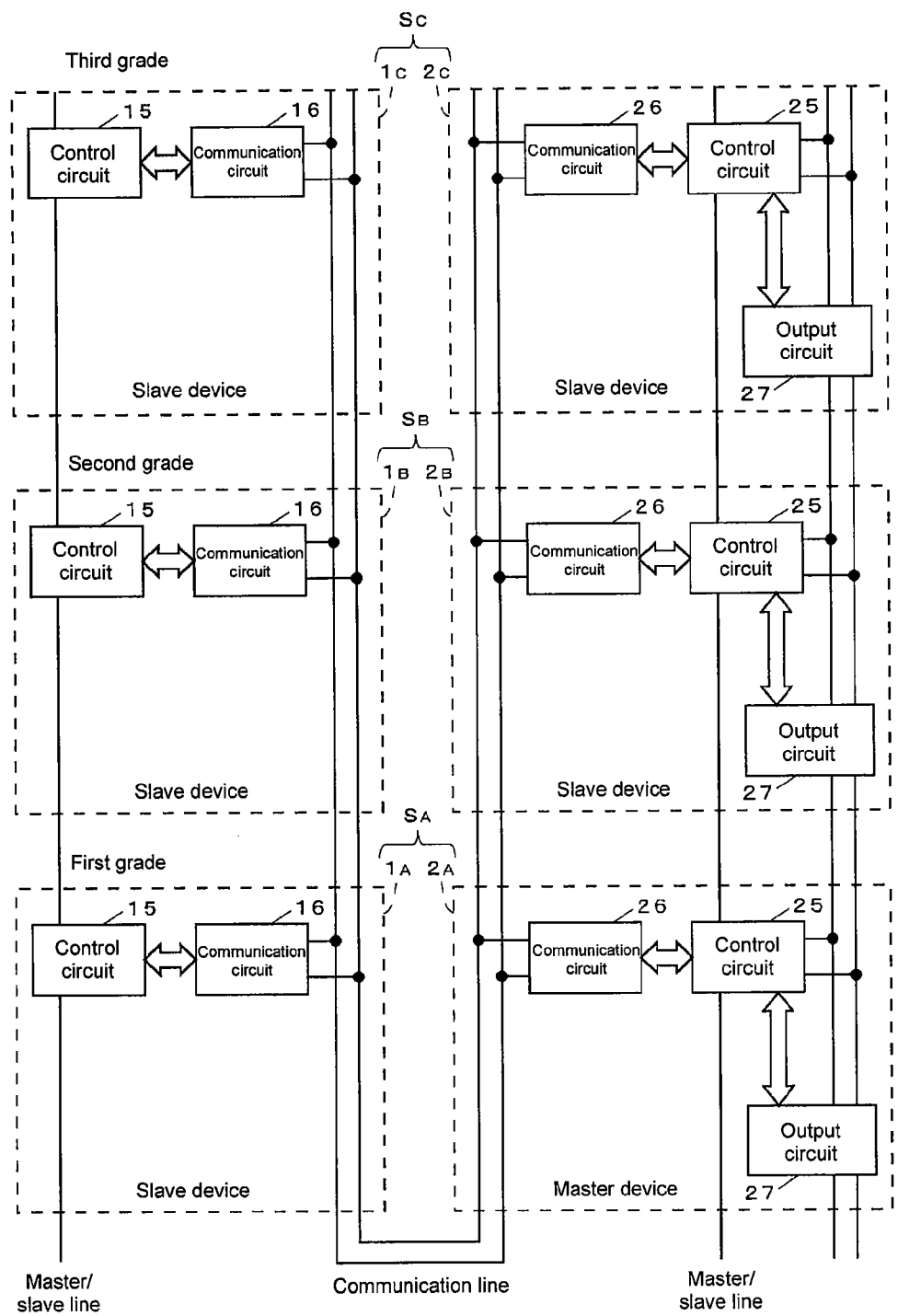
FIG. 3 is a block diagram showing a relationship between devices when a system is configured by a plurality of multiple-optical-axis photoelectric sensors.

The multiple-optical-axis photoelectric sensor S may be independently operated. However, a plurality of photoelectric sensors S can also be connected through a cord line 101, a connection cord, or the like shown in FIG. 1 and then operated. FIG. 3 shows an example of the connection, between a sensor $S_A$ obtained by a combination of a projector $1_A$ and an optical receiver $2_A$, a sensor $S_B$ obtained by a combination of a projector $1_B$ and an optical receiver $2_B$, and a sensor $S_C$ obtained by a combination of a projector $1_C$ and a optical receiver $2_C$, the projectors are connected to each other, and the optical receivers are connected to each other. The projector $1_A$ and the optical receiver $2_A$ located at one end of each connection structure are connected to each other through a cable.

In FIG. 3, with respect to the projectors $1_A$, $1_B$, and $1_C$, the control circuit 15 and the communication circuit 16 are shown by symbols shown in FIG. 2, and with respect to the optical receivers $2_A$, $2_B$, and $2_C$, the control circuit 25, the communication circuit 26, and the output circuit 27 are shown by symbols shown in FIG. 2. In the following description, the sensors $S_A$, $S_B$, and $S_C$, the projectors $1_A$, $1_B$, and $1_C$, and the optical receivers $2_A$, $2_B$, and $2_C$ are collectively called as a "sensor S", a "projector 1", and an "optical receiver 2". The projector 1 and the optical receiver 2 may be collectively called "devices".

In the arrangement of the actual sensors $S_A$, $S_B$, and $S_C$, the projector 1 and the optical receiver 2 may be aligned (vertically aligned) along a longitudinal direction or aligned (horizontally aligned) along a direction of width. The devices may be arranged without being aligned.

As shown in FIG. 3, the devices are connected to each other so that the control circuit 15 between the projectors 1 and the control circuit 25 between the optical receivers 2 are connected in series with each other through signal lines (master/slave lines), respectively. As will be described later, the devices exchange signals through the connection to recognize a master device or a slave device as its own device.

The communication circuits 16 and 26 of the devices are connected to a communication line that forms a loop through the projector $1_A$ and the optical receiver $2_A$ of the sensor $S_A$. In this manner, the communication circuits 16 and 26 of the devices are looped to make it possible to cause the projector 1 and the optical receiver 2 of each of the sensors S to communicate with each other, and devices belonging to the different sensors S can also communicate with each other.

Terminals of the output circuit 27 of each of the optical receivers 2 are connected in series with each other, and an output from the output circuit 27 of the optical receiver $2_A$ is externally output as a detection signal. Although not shown in FIG. 3, the power supply circuits 18 and 28 of the devices are also connected to a common line extending from the external power supply 5.

The control circuits 25 of the optical receivers 2 are connected to an output line to receive a fed-back state of the detection signal.

In the embodiment, the sensor $S_A$ in which the projector $1_A$ and the optical receiver $2_A$ are connected to each other serves as a first-grade sensor, the sensor $S_B$ connected to the sensor $S_A$ serves as a second-grade sensor, and the sensor $S_C$ connected to the sensor $S_B$ serves as a third-grade sensor. In this embodiment, the optical receiver $2_A$ of the sensor $S_A$ functions as a master device, and the projectors $1_B$ and $1_C$ and the optical receivers $2_B$ and $2_C$ in the other sensors $S_B$ and $S_C$ and the projector $1_A$ of the sensor $S_A$ are set as slave devices. However, in the projector $1_A$ of the sensor $S_A$, a function of managing the other projectors $1_B$ and $1_C$ as slave devices paired with the master device is set.

Allocation of the master device and the slave devices and ranking of the devices are fixed such that the following processes are performed at the start of the system every hour.

When the control circuits 15 and 25 of the devices are activated by turning on the power supply from the common power supply, the control circuits 15 and 25 simultaneously start a process of outputting a pulse signal to an upper master/slave line of its own device. The control circuits 15 and 25, while continuously outputting the pulse signals, checks whether a pulse signal is input from a lower master/slave line of its own device. According to the configuration in FIG. 3, the pulse signal is not input to the projector $1_A$ and the optical receiver $2_A$ of the sensor $S_A$, and the pulse signal is input to the other devices.

The control circuit 25 of the optical receiver $2_A$ recognizes its own device as a master device when it does not receive the pulse signal. The outputting of the pulse signal is stopped, and communication to allocate addresses to the slave device is started. The optical receiver $2_A$ is rephrased as the master device $2_A$ as needed.

The control circuits 25 of the other optical receivers $2_B$ and $2_C$ recognize its own device as the slave device when receives a pulse signal. Thereafter, when inputting of a pulse signal is stopped, communication is performed in response to a command from the master device $2_A$, and the master device $2_A$ is notified of an attribute (type of the device, the number of optical axes, or the like) of its own device. Its own device receives an address and registers the address in the memory. In the optical receivers $2_B$ and $2_C$ that perform the above processes, outputting of a pulse signal to the upper master/slave line is stopped.

Thus, the optical receiver $2_B$ that has not received an input of a pulse signal from the master device $2_A$ communicates with the master device $2_A$ at first, and the optical receiver $2_C$ performs communication next. In the master device $2_A$, an order is set by an order of enabling the optical receivers $2_B$ and $2_C$ to perform communication, addresses are allocated to the optical receivers $2_B$ and $2_C$, and the addresses and the attributes of which the optical receivers $2_B$ and $2_C$ notify are registered in association with each other.

The control circuit 15 of the projector $1_A$ recognizes its own device as a slave device paired with the master device when it does not receive a pulse signal. Thereafter, as in the optical receivers $2_B$ and $2_C$, the control circuit 15 receives an address in response to a command from the master device $2_A$ and notifies that its own device is a projector corresponding to the master device $2_A$. Upon completion of the communication, the projector $1_A$ stops outputting of a pulse signal and, thereafter, according to an instruction of the optical receiver $2_A$, performs the same communication as that performed to the optical receivers $2_B$ and $2_C$ by the optical receiver $2_A$ to the lower projectors $1_B$ and $1_C$.

The projectors $1_B$ and $1_C$ recognize, in response to an input of a pulse signal, that its own device is a general slave device, sequentially communicate with the projector $1_A$ by the same procedure as that in the optical receivers $2_B$ and $2_C$ to receive address notifications. The projectors $2_B$ and $2_C$ also transmit pieces of information representing an attribute of its own device. The pieces of information are transmitted to the master device $2_A$ through the projector $1_A$.

As described above, in the embodiment, the optical receiver $2_A$ of the sensor $S_A$ is functioned as a master device, and a function of managing the lower projectors $1_B$ and $1_C$ in response to an instruction of the master device $2_A$ is given to the projector $1_A$. This relation may be reverse.

By the connection and the communication and the recognition process between the devices, an object detection system is structured by the sensors $S_A$, $S_B$, and $S_C$. In this system, the detection process in the uppermost sensor sensor $S_A$ is executed first, and the detection processes in the sensors $S_g$ and $S_C$ are executed subsequently such that the timing of the detection process in one of the sensors does not overlap periods of the detection processes in the other sensors S. When a light-shielding state of an optical axis is detected in the detection process in any one of the sensors S, an output from the output circuit 27 of the sensor S is turned off. In this manner, a detection signal output from the master device $2_A$ is turned off.

Figure 4:
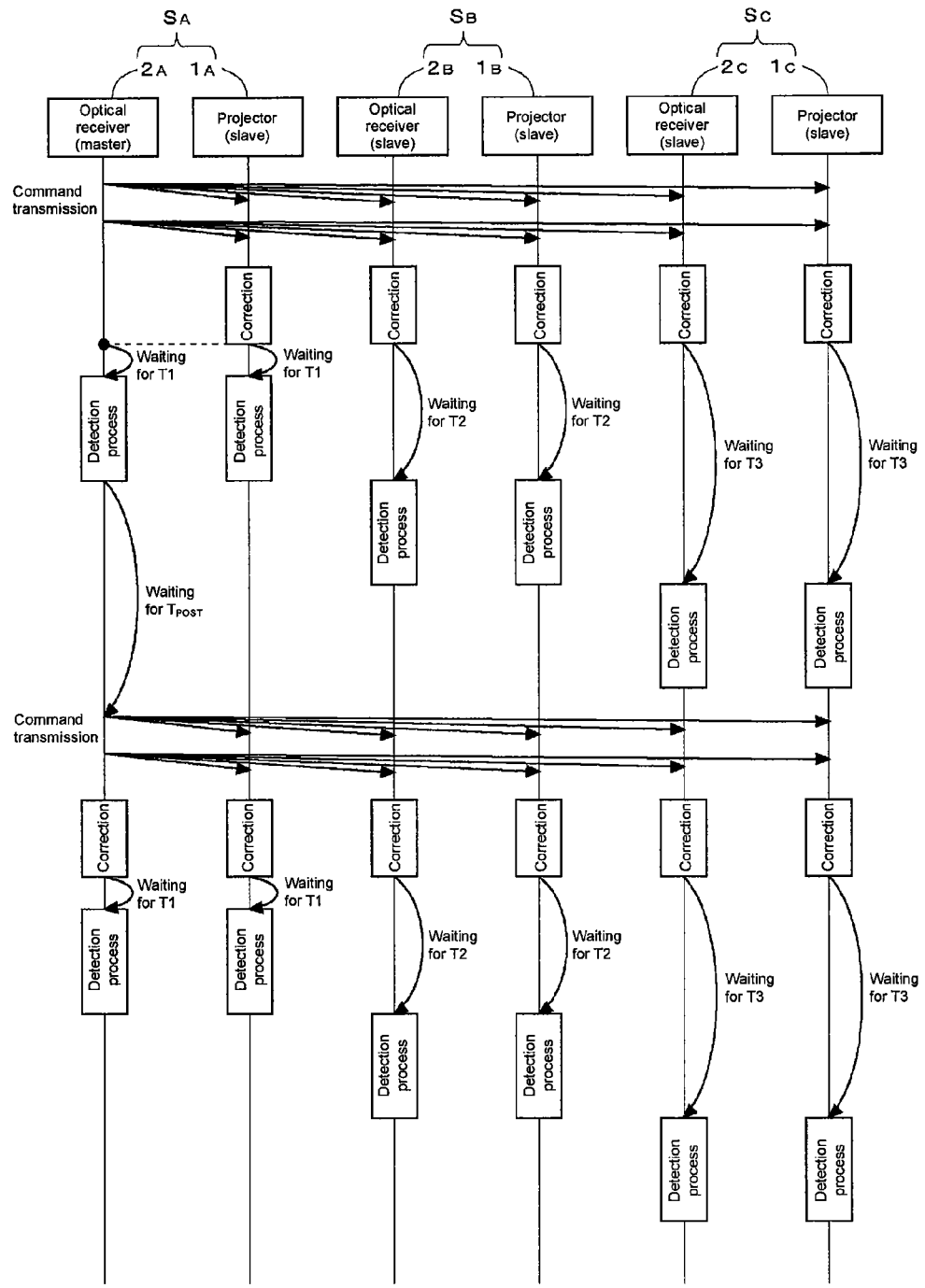
FIG. 4 is a diagram showing an example of a sequence of a detection process in each sensor.

FIG. 4 shows a sequence of a detection process in the system.

Pieces of definition information representing start timings of detection processes are registered in the devices in the embodiment in advance. The optical receiver $2_A$ of the sensor $1_A$ functioning as the master device transmits command signals to request the operations of the timers to be synchronized with each other to the slave devices.

In order to improve the accuracy of transmission/reception of a command signal, the master device continuously transmits command signals twice, and the slave device corrects the operation of the timer in its own device when the slave device receives a command signal at least once. The correction process is performed as, for example, a process that an operation clock representing a timing of time measurement is led again a predetermined period of time after the command signal is received. Time from reception of a command to correction of the command is set on the basis of the length of a time required for communication between the master device $2_A$ and the slave device when the master device $2_A$ and the slave device communicate with each other at the start of the system, and registered in the memories of the slave devices. Each of the command signals includes identification data representing what number of transmission the command is obtained at. In the slave device, when the identification data of a command signal received first represents the second transmission, the timing of correction of the timer is adjusted on the basis of a time interval at which the command signals are transmitted.

According to the correction process, each slave device is set in a state in which a time-measurement operation is performed at a timing synchronized with the master device $2_A$. Each slave device sets the time point of the correction as a reference time point. Even the master device $2_A$, on the basis of the number of clocks generated after a command is transmitted, sets a reference time point at the same timing as that of each slave timing. In this manner, reference time points in the devices are synchronized with each other. Setting of a reference time point in the embodiment is performed as a process of resetting a measured time of a timer to zero. Without performing the resetting, an elapsed time from the reference time point need only be managed.

In each of the devices, as definition information representing a timing at which a detection process is started, waiting times T1, T2, and T3 from a reference time point to a time point at which the detection process is started are registered. Furthermore, the definition information of the master device $2_A$ includes a waiting time $T_{POST}$ from the start of a detection process to a time point at which the next command is transmitted.

The devices wait until the waiting times T1, T2, and T3 have elapsed from the reference time points, and start detection processes in response to elapse of the waiting times.

In each of the optical receiver $2_B$ and the projector $1_B$ of the second-grade sensor $S_B$, a waiting time T2 longer than the waiting time T1 of the first-grade sensor $S_A$ is set. However, the time T2 is set to have such a length that a detection process can be rapidly started in response to the end of the detection process by the sensor $S_A$.

In each of the optical receiver $2_C$ and the projector $1_B$ of the third-grade sensor $S_B$, a waiting time T3 longer than the waiting time T2 of the second-grade sensor $S_B$ is set. However, the waiting time T3 is set to have such a length that a detection process can be rapidly started in response to the end of the detection process by the second-grade sensor $S_B$.

In the embodiment, inter-sensor communication and in-sensor communication are not performed before the detection process, the timings of the detection processes in the projector 1 and the optical receiver 2 that are paired are synchronized by the setting of the waiting times T1 to T3 and the correction processes of the timers, an order and timer intervals of the detection processes in the sensors S are maintained. Since times for communication need not be included in the respective waiting times T1 to T3, a cycle of the detection processes by the sensors $S_A$, $S_B$, and $S_C$ can be considerably shortened to make it possible to increase the processing speed in the entire system.

Although not shown in FIG. 4, in each of the sensors $S_A$, $S_B$, and $S_C$, in addition to a detection process, information processing related to various functions such as muting and blanking and output control depending on a processing result are performed (the processes are collectively called "functional processes" hereinafter), and a self-diagnosis process that checks states of the circuits is executed. In these processes, although the in-sensor communication may be required, all the processes can be performed in parallel with each other while detection processes are performed in the other sensors S. The functional process and the self-diagnosis process are normally performed subsequent to a detection process. However, the functional process and the self-diagnosis process may be performed by using a waiting time before the detection process. In this manner, upon completion of the detection process by the third-grade sensor $S_B$, the next command can be transmitted from the master device $2_A$ without a long interval, and the processing time can be further shortened.

Figure 5:
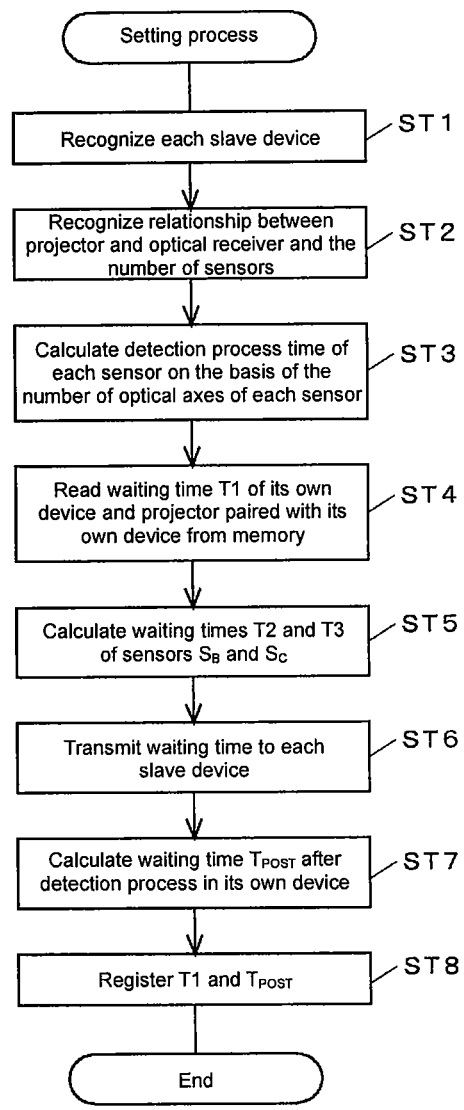
FIG. 5 is a flow chart showing a procedure of a setting process in a master device.

The definition information to realize the sequence in FIG. 4 is produced such that the optical receiver $2_A$ of the sensor $S_A$ that recognizes the device as the master device after the system is started performs a setting process shown in FIG. 5. Details of the setting process will be described below with reference to FIG. 5.

The master device $2_A$ sequentially communicate with the slave devices to recognize the attributes (the slave device is the projector 1 or the optical receiver 2, the number of optical axes, and the like) of the slave devices, and gives orders and addresses to the slave devices (step ST1). The detailed processing contents are as described above.

Upon completion of the recognition of the slave devices, in step ST2, on the basis of recognition results and the orders, relationships to the projector 1 and the optical receiver 2 or the number of sensors S are recognized.

In step ST3, then, on the basis of the number of optical axes of each of the sensors S, a time (to be referred to as a "detection process time" hereinafter) required for a detection process is calculated for each of the sensors $S_A$, $S_B$, and $S_C$.

Of the waiting times T1 to T3, with respect to the waiting time T1 set in the uppermost sensor $S_A$, a proper time length is determined in advance, and the time length is registered in the memory of each of the optical receivers 2 as fixed data. The optical receiver $2_A$ serving as the master device reads the waiting time T1 in step ST4 and sets the waiting time T1 as waiting times of its own device and the projector $1_A$ paired with its own device.

Furthermore, in step ST5, the master device $2_A$, by using the waiting time T1 and the detection process times of the sensors $S_A$ and $S_B$, calculates the waiting time T2 of the sensor $S_B$ and the waiting time T3 of the sensor $S_C$.

In step ST6, waiting times corresponding to the respective slave devices are transmitted. More specifically, the addresses of the respective devices and the waiting times T1, T2, and T3 are combined to each other, and the resultant combinations are transmitted as information in units of sensors or units of devices. The transmitted pieces of information arrive at all the slave devices, and in the slave devices the waiting time combined to the address of its own device is employed and stored in the memory. Thus, in all the slave devices, waiting times required to correctly perform detection processes can be registered.

A method of transmitting a waiting time is not limited to the above method. All combinations between addresses and waiting times are transmitted at once, and each of the slave devices may extract information corresponding to its own device from the received information and registers the information.

Furthermore, the master device $2_A$ calculates a waiting time $T_{POST}$ after the detection process in its own device on the basis of the waiting times and the detection process times in the sensors S (step ST7). The waiting time T1 and the $T_{POST}$ are stored in a memory as definition information matched with its own device (step ST8), and the process is ended.

Figure 6:
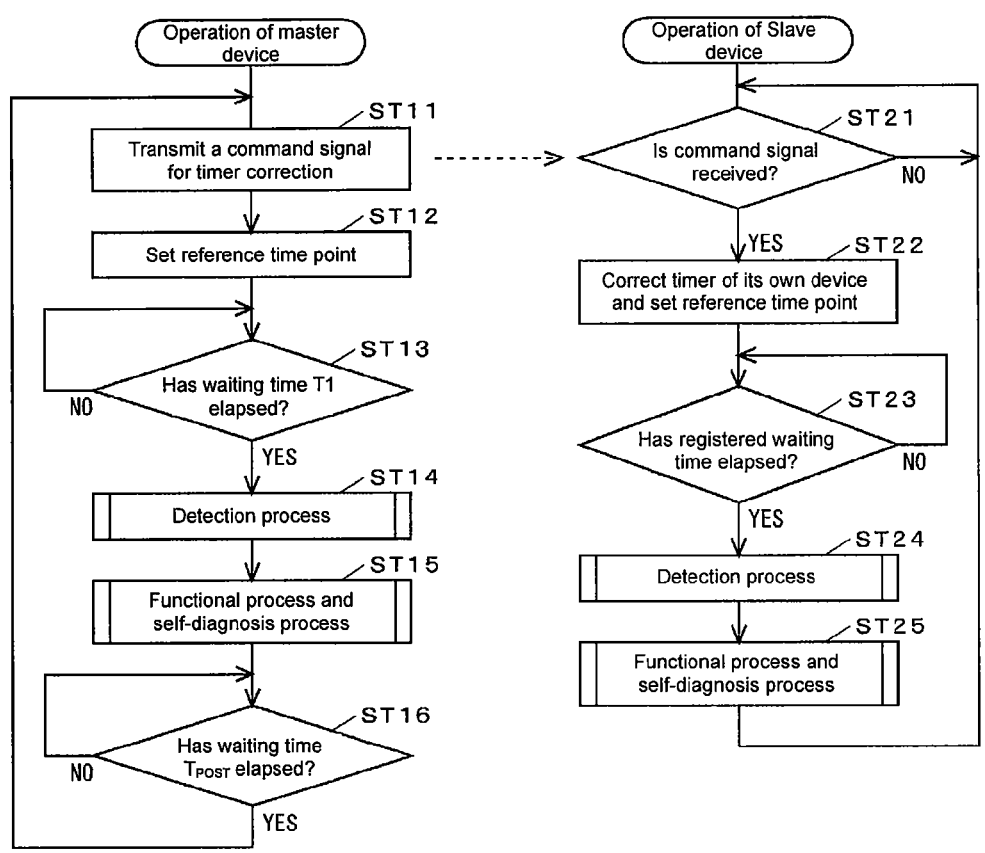
FIG. 6 is a flow chart showing a procedure executed when the respective devices operate on the basis of a set waiting time.

FIG. 6 shows procedures performed when the respective devices operate on the basis of the registered waiting times in units of types of the devices.

In the master device $2_A$, command signals for timer correction are simultaneously transmitted to the slave devices (step ST11). Each of the slave devices corrects the timer of its own device depending on the reception of the command signal and sets a time point of the correction as a reference time point (steps S21 and S22). Even in the master device $2_A$, after the transmission of the command signals, a reference time point is set to a timing that is the timing of correction of the timer in each of the slave devices (step S12). As described above, by the transmission/reception of the command signals, the operation clocks of the slave devices are synchronized with the operation clock of the master device $2_A$, and the reference time points in the respective devices are equal to each other. For this reason, recognitions of the devices to elapsed times after the reference time points can be aligned.

Thereafter, the master device $2_A$ waits until the waiting time T1 has elapsed, when the waiting time T1 has elapsed ("YES" in ST13), the master device $2_A$ executes a detection process (step ST14). Upon completion of the detection process, subsequently, a functional process and a self-diagnosis process are executed (step ST15). Upon completion of these processes, the master device waits while comparing a time after the end of the detection process with the waiting time $T_{POST}$ (step ST16).

On the other hand, the slave device, after timer correction is performed in step ST22, waits until the waiting time registered in its own device has elapsed. When the waiting time has elapsed ("YES" in ST23), the detection process is executed (step ST24), and, subsequently, a functional process and a self-diagnosis process are executed (step ST25). Upon completion of these processes, the slave device returns to step ST21 to wait for the next command signal from the master device $2_A$. When the waiting time is longer than a time required for the functional process or the self-diagnosis process, these processes may be performed before the detection process.

When a time after the detection process reaches the time point $T_{POST}$ ("YES" in ST16), the master device $2_A$ returns to step ST11 to transmit a command signal again, and resets the reference time point of its own device (step ST12). The slave device that receives the command signal corrects the timer of its own device and resets the reference time point (steps ST21 and ST22). The same procedure as described above is repeated in each of the devices to circulate the detection processes in each inspection.

As shown in FIG. 6, in the embodiment, the respective devices set reference time points at the same timing on the initiative of the master device $2_A$, without performing inter-sensor communication or in-sensor communication, the devices start the detection processes while independently managing times. Thus, control procedures of the respective devices can be simplified, and a circulation period of the detection processes can be considerably shortened. Since reference time points of the respective devices are resets each time the circuit of the detection processes is made, operation times of the projector 1 and the optical receiver 2 paired with each other can be prevented from being different from each other, and start times of the detection processes in the respective sensors can be prevented from being different from each other backward and forward.

In the embodiment, the waiting time $T_{POST}$ is registered in the master device $2_A$ to make it possible to transmit a command signal each time a circuit of the detection processes in the devices is made. However, without registering the $T_{POST}$, by using the detection process times and the waiting times of the respective devices, it may be recognized that a circuit of the detection processes is made to make it possible to transmit the command signal. In the above embodiment, even in the master device $2_A$, the timers are reset at the same timing in the respective slave devices, and start timings of the detection processes are determined by using the same waiting time T1 as that in the projector $1_A$ paired with the master device $2_A$. However, this process need not be performed. For example, the master device $2_A$ may start the detection process by using a time point at which a command signal is transmitted as a reference point in response to elapse of a time obtained by adding the waiting time T1 to a time required to complete correction of the timer in each of the slave devices from the reference time point.

Figure 7:
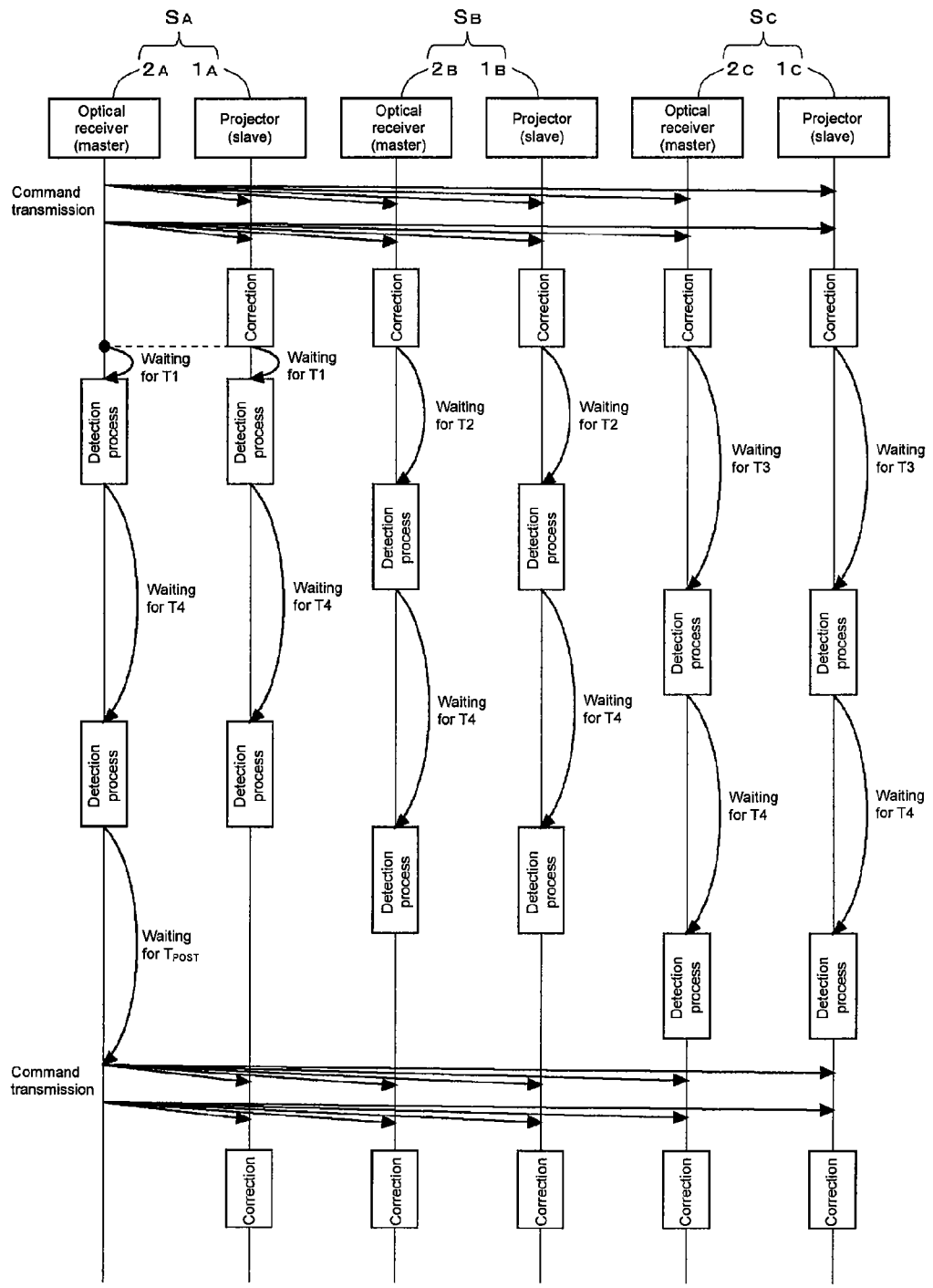
FIG. 7 is a diagram showing another example of a sequence of a detection process in each sensor.
Figure 8:
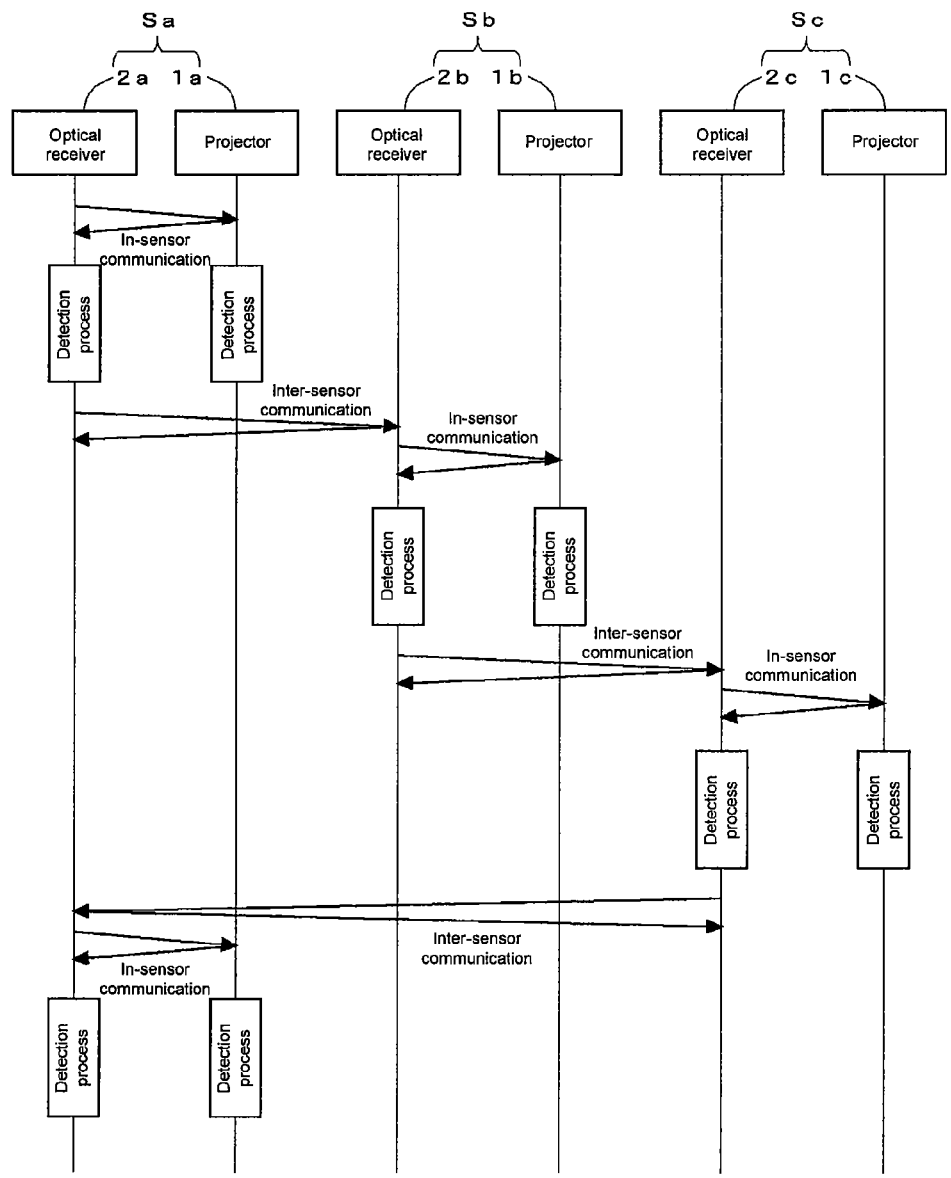
FIG. 8 is a diagram showing a sequence of a conventional detection process.

When alignment of operation clocks of the respective devices can be secured for a relatively long time, each time a circuit of the detection processes is made, command signals need not be transmitted. As shown in FIG. 7, after detection processes in a plurality of cycles (e.g. two cycles in FIG. 7) are performed, command signals may be transmitted.

In the example in FIG. 7, in the master device $2_A$, as in the example in FIG. 4, in addition to the waiting times T1 and $T_{POST}$, a waiting time T4 until the next detection processes are started after the detection processes are ended is registered. In each of the slave devices, in addition to the waiting times T1 to T3 before detection, the same waiting time T4 as in the master device $2_A$ is registered.

The waiting time T4 is used to manage a circulating period of detection processes. The waiting time T4 may be set to have a length equal to that of the waiting time $T_{POST}$. However, the waiting time T4 may be set to have a length shorter than that of the waiting time $T_{POST}$ as long as the waiting time T4 does not influence the time for the functional process or the self-diagnosis process.

Also in this example, as in the example in FIG. 4, the timers are corrected in the respective slave devices in response to transmission of a command signal from the master device $2_A$, and time points of correction of the timers are set to reference time points in the devices including the master device $2_A$. The master device $2_A$ executes a detection process in response to elapse of the waiting time T1 from the reference time point. The slave devices execute detection processes in response to elapse of the waiting times T1, T2, and T3 corresponding to its own device from the reference time point.

In the master device $2_A$, each time a detection process is started, the number of times of execution of the detection time is counted. Until the count reaches a predetermined upper-limit value, the next detection process is executed when an elapsed time after the detection process reaches the waiting time T4. Even in the slave device, the waiting time T4 has elapsed without receiving a command from the master device $2_A$ after the detection process, the next detection process is spontaneously executed.

In the master device $2_A$, when the count of the number of times of execution of the detection process reaches the predetermined upper-limit value, command signals are transmitted to the respective slave devices in response to elapse of the waiting time $T_{POST}$ after the detection process in execution is ended to update the reference time points. Each of the slave devices corrects the timer of its own device in response to reception of a command signal, and sets the time point of correction as a new reference time point.

When the same procedures as described above are repeated in each of the devices, each time a circuit of detection processes in each of the sensors S is made a predetermined number of times, the operation of the timer in each of the slave devices is corrected, and the reference time points of all the devices including the master device are updated. In this manner, measured times in the respective devices are aligned to make it possible to maintain the accuracy of progress of the detection processes in the sensors S.

The master device $2_A$ may transmit information, such as information related to control of muting and interlocking, to be shared by the respective devices to the slave devices. However, the pieces of information can be simultaneously transmitted to the slave devices together with the command signals.

In the embodiment, after the system is started, definition information representing a timing of a detection process is transmitted to each of the slave devices, and, subsequently, the detection process is performed in a regular cycle on the basis of the definition information. However, the present invention is not limited to the embodiment. For example, in the master device, a function of changing a start timing of a detection process in its own device depending on an influence of ambient light or the like is set, and the start timing of the detection process is changed by the function. In this case, before the detection process is performed at the changed timing, pieces of information representing a timing difference (positive or negative value) between the start timing before the change and the start timing after the change may be simultaneously transmitted to the respective slave devices together with command signals. The slave device that receives the transmitted information adds a difference represented by the received information to a waiting time registered in its own device to update the waiting time, and subsequently determines a start timing of the detection process by using the updated waiting time.

According to the above process, when a start timing of the detection process in the master device $2_A$ is changed, start timings of the detection processes in the respective slave devices performed immediately after the change of the start timing are changed in accordance with the timing in the master device $2_A$.

In the embodiment, at the start of the system, after each of the devices recognizes its own device as the master device or the slave device, the setting process shown in FIG. 5 is performed in the master device to set definition information representing a timing of a detection process in each of the devices. For this reason, even though the configuration of the system is changed, the system can easily cope with the changed configuration. However, the configuration need not always be used, each of the devices may store a recognition result related to the type of the device and definition information even after a power supply is turned off, the pieces of information may be deleted in response to an input of an external reset signal, and the recognition process or the definition information setting process may be performed again.

DESCRIPTION OF SYMBOLS

S ($S_A$, $S_B$, $S_C$) Multiple-optical-axis photoelectric sensor
1 Projector
2 Optical receiver
$2_A$ Master device
$1_A$, $1_B$, $1_C$, $2_B$, $2_C$ Slave device
11 Light emitting element
21 Light receiving element
14, 24 Optical axis sequentially-selecting circuit
15, 25 Control circuit
16, 26 Communication circuit

The invention claimed is:

1. An object detection system in which projectors and optical receivers of a plurality of multiple-optical-axis photoelectric sensors are connected to each other through communication lines to cause detection processes of the respective sensors to sequentially proceed on the basis of communication between the sensors, wherein the projector and the optical receiver of each of the multiple-optical-axis photoelectric sensors comprise timers configured to determine timings of operations in their own devices, respectively, the projector and the optical receiver in each of the multiple-optical-axis photoelectric sensors available to be a master device, with only one of the projectors and optical receivers individually functioning as the master device, the master device comprises a definition information producer configured to produce definition information that determines timings of detection processes in the respective devices including its own device on the basis of relationships between sensors in the system and the number of optical axes of the respective sensors, a definition information transmitter configured to transmit the definition information to the other devices in the system respectively, a timer controller configured, while recognizing a circulating period of the detection processes in the respective sensors on the basis of a measured time obtained by the timer of its own device and the definition information, to simultaneously transmit commands to require the operations of the timers to be synchronized with each other to the other devices in response to elapse of a time corresponding to a period in which the circulating period proceeds by a predetermined cycle, and a master detection controller configured to determine a timing at which the detection process should be executed on the basis of definition information matched with its own devices to execute the detection process, and each of the devices except for the master device comprises a storage configured to store the definition information transmitted from the master device, a timer corrector configured to correct the timer of its own device in response to a command from the master device, and a detection controller configured to determine a timing at which the detection process should be executed with reference to a time point at which the timer is corrected on the basis of the definition information matched with its own device to execute the detection process.

2. The object detection system according to claim 1, wherein the definition information producer of the master device produces, for the respective devices including its own device, definition information representing a waiting time from a reference time point until a detection process is started, the timer controller of the master device executes simultaneous transmission of commands to require the operations of the timers to be synchronized with each other each time a time corresponding to a period in which a circuit of the detection processes in the respective sensors is made has elapsed, the detection controller of each of the devices except for the master device sets a time point at which the timer is corrected as a reference time point, the master device sets a time point at which a time from transmission of a command until the timers of the other devices are corrected has elapsed as a reference time point, and in response to elapse of a waiting time represented by the defined information matched with its own device from each of the reference time points, the detection processes are executed.

3. The object detection system according to claim 1, wherein the definition information producer of the master device produces, for the devices including its own device, definition information including information representing a waiting time from a reference time point until a detection process is started and information representing a circulating period of the detection processes, the timer controller of the master device executes simultaneous transmission of commands to require the operations of the timers to be synchronized with each other in response to elapse of a time corresponding to a period in which the detection processes of the sensors are circulated by two or more predetermined cycles, the detection controller of each of the devices except for the master device sets a time point at which the timer is corrected as a reference time point, the master device sets a time point at which a time from transmission of a command until the timers of the other devices are corrected has elapsed as a reference time point, and, after the detection processes are executed in response to elapse of a waiting time represented by the defined information matched with its own device from each of the reference time points, the detection processes are repeatedly executed according to a circulating period represented by the definition information.

4. The object detection system according to claim 1, wherein the master device further comprises a timing changer configured to change definition information matched with its own device such that a start timing of a detection process in its own device is changed, the timer controller of the master device, before a detection process based on the definition information changed by the timing changer is started, simultaneously transmits information representing a timing difference between a start timing of a detection process before the change of the definition information and a start timing of a detection process after the change of the definition information to the other devices together with commands to require the operations of the timers to be synchronized, in each of the devices that receives the transmission, the timer of its own device is corrected, and definition information in the storage of its own device is updated by using the information transmitted together with the command before the detection process in its own device is started.

5. The object detection system according to claim 1, wherein the timer controller of the master device simultaneously transmits information that should be shared by the devices including its own device to the other devices together with a command to require the operations of the timers to be synchronized with each other.

6. The object detection system according to claim 1, wherein the definition information producer of the master device is activated and then communicates with the other devices to recognize a relationship between the sensors in the system and the number of axes of each of the sensors, and produces the definition information on the basis of the recognition result, and the definition information transmitter transmits the definition information to the other devices in response to completion of production of the definition information.

7. The object detection system according to claim 2, wherein the master device further comprises a timing changer configured to change definition information matched with its own device such that a start timing of a detection process in its own device is changed, the timer controller of the master device, before a detection process based on the definition information changed by the timing changer is started, simultaneously transmits information representing a timing difference between a start timing of a detection process before the change of the definition information and a start timing of a detection process after the change of the definition information to the other devices together with commands to require the operations of the timers to be synchronized, in each of the devices that receives the transmission, the timer of its own device is corrected, and definition information in the storage of its own device is updated by using the information transmitted together with the command before the detection process in its own device is started.

8. The object detection system according to claim 3, wherein the master device further comprises a timing changer configured to change definition information matched with its own device such that a start timing of a detection process in its own device is changed, the timer controller of the master device, before a detection process based on the definition information changed by the timing changer is started, simultaneously transmits information representing a timing difference between a start timing of a detection process before the change of the definition information and a start timing of a detection process after the change of the definition information to the other devices together with commands to require the operations of the timers to be synchronized, in each of the devices that receives the transmission, the timer of its own device is corrected, and definition information in the storage of its own device is updated by using the information transmitted together with the command before the detection process in its own device is started.

* * * * *